(12) United States Patent
Kim et al.

(10) Patent No.: US 11,037,766 B2
(45) Date of Patent: Jun. 15, 2021

(54) SUBSTRATE SUPPORT APPARATUS AND PLASMA PROCESSING APPARATUS HAVING THE SAME

(71) Applicant: SAMSUNG ELECTRONICS CO., LTD., Suwon-si (KR)

(72) Inventors: Kwang-Nam Kim, Suwon-si (KR); Sung-Yeon Kim, Jeongeup-si (KR); Hyung-Jun Kim, Suwon-si (KR); Jong-Woo Sun, Hwaseong-si (KR); Sang-Rok Oh, Yongin-si (KR); Jung-Pyo Hong, Gwangmyeong-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 91 days.

(21) Appl. No.: 16/268,790

(22) Filed: Feb. 6, 2019

(65) Prior Publication Data
US 2020/0027705 A1    Jan. 23, 2020

(30) Foreign Application Priority Data

Jul. 23, 2018 (KR) .......................... 10-2018-0085195

(51) Int. Cl.
*H01J 37/32* (2006.01)
*H01L 21/683* (2006.01)
*H01L 21/67* (2006.01)

(52) U.S. Cl.
CPC .... *H01J 37/32697* (2013.01); *H01J 37/3244* (2013.01); *H01J 37/32183* (2013.01); *H01J 37/32715* (2013.01); *H01L 21/6833* (2013.01); *H01J 37/3211* (2013.01); *H01J 2237/334* (2013.01); *H01L 21/67069* (2013.01)

(58) Field of Classification Search
CPC .......... H01J 37/32697; H01J 37/32183; H01J 37/3244; H01J 37/32715; H01J 37/3211; H01J 2237/334; H01J 37/20; H01J 37/3053; H01J 37/026; H01L 21/6833; H01L 21/67069; H01L 21/68735
USPC ..................................................... 156/345.51
See application file for complete search history.

(56) References Cited

U.S. PATENT DOCUMENTS

| | | | |
|---|---|---|---|
| 8,383,002 B2 | 2/2013 | Katz et al. | |
| 9,184,072 B2 | 11/2015 | Devine et al. | |
| 9,251,998 B2 | 2/2016 | Hanaoka | |
| 9,852,889 B1 | 12/2017 | Kellogg et al. | |
| 9,881,772 B2 | 1/2018 | Marakhatanov et al. | |
| 2012/0160418 A1* | 6/2012 | Hanaoka ........... | H01J 37/32082 156/345.38 |
| 2014/0053984 A1 | 2/2014 | Doh et al. | |
| 2017/0330734 A1 | 11/2017 | Lee et al. | |

FOREIGN PATENT DOCUMENTS

JP    2007-048826 A    2/2007

\* cited by examiner

*Primary Examiner* — Ram N Kackar
(74) *Attorney, Agent, or Firm* — Lee IP Law, P.C.

(57) ABSTRACT

A substrate support apparatus includes a substrate stage to support a substrate, and a ground ring assembly along a circumference of the substrate stage, the ground ring assembly including a ground ring body, the ground ring body having a plurality of recesses along a circumferential portion thereof, and a plurality of ground blocks movable to be received into respective recesses of the plurality of recesses, the plurality of ground blocks including a conductive material to be electrically grounded.

18 Claims, 7 Drawing Sheets

SUBSTRATE SUPPORT APPARATUS AND PLASMA PROCESSING APPARATUS HAVING THE SAME

CROSS-REFERENCE TO RELATED APPLICATION

Korean Patent Application No. 10-2018-0085195, filed on Jul. 23, 2018, in the Korean Intellectual Property Office (KIPO), and entitled: "Substrate Support Apparatus and Plasma Processing Apparatus Having the Same," is incorporated by reference herein in its entirety.

BACKGROUND

1. Field

Example embodiments relate to a substrate support apparatus and a plasma processing apparatus. More particularly, example embodiments relate to a substrate support apparatus for supporting a wafer within a plasma chamber and a plasma processing apparatus including the same.

2. Description of the Related Art

Many types of semiconductor devices may be manufactured using plasma-based etching techniques. For example, a plasma etching apparatus such as an inductively coupled plasma etching apparatus may generate plasma within a chamber to perform an etching process.

SUMMARY

According to example embodiments, a substrate support apparatus includes a substrate stage to support a substrate, and a ground ring assembly along a circumference of the substrate stage, the ground ring assembly including a ground ring body, the ground ring body having a plurality of recesses along a circumferential portion thereof, and a plurality of ground blocks movable to be received into respective recesses of the plurality of recesses, the plurality of ground blocks including a conductive material to be electrically grounded.

According to example embodiments, a substrate support apparatus includes a substrate stage to support a substrate, a ground ring assembly installed along a circumference of the substrate stage, and including a ground ring body and a plurality of ground blocks formed of a conductive material to be electrically grounded, the ground ring body having a plurality of recesses formed along a circumferential portion thereof, the ground blocks being installed movable to be received into the respective recesses, and a baffle member arranged above the ground ring body along the circumference of the substrate stage and electrically connected to the ground ring body.

According to example embodiments, a plasma processing apparatus includes a chamber providing a space for processing a substrate, a substrate stage to support the substrate within the chamber and including a lower electrode, an upper electrode arranged in an upper portion of the chamber to face the lower electrode, a first power supply to apply a plasma power to the upper electrode, a second power supply to apply a bias power to the lower electrode, and a ground ring assembly installed along a circumference of the substrate stage, and including an annular-shaped ground ring body and a plurality of ground blocks, the ground ring body having a plurality of recesses formed along a circumferential portion thereof, the ground blocks being installed movable to be received into the respective recesses.

BRIEF DESCRIPTION OF THE DRAWINGS

Features will become apparent to those of skill in the art by describing in detail exemplary embodiments with reference to the attached drawings in which.

DETAILED DESCRIPTION

Hereinafter, example embodiments will be explained in detail with reference to the accompanying drawings.

Figure 1:
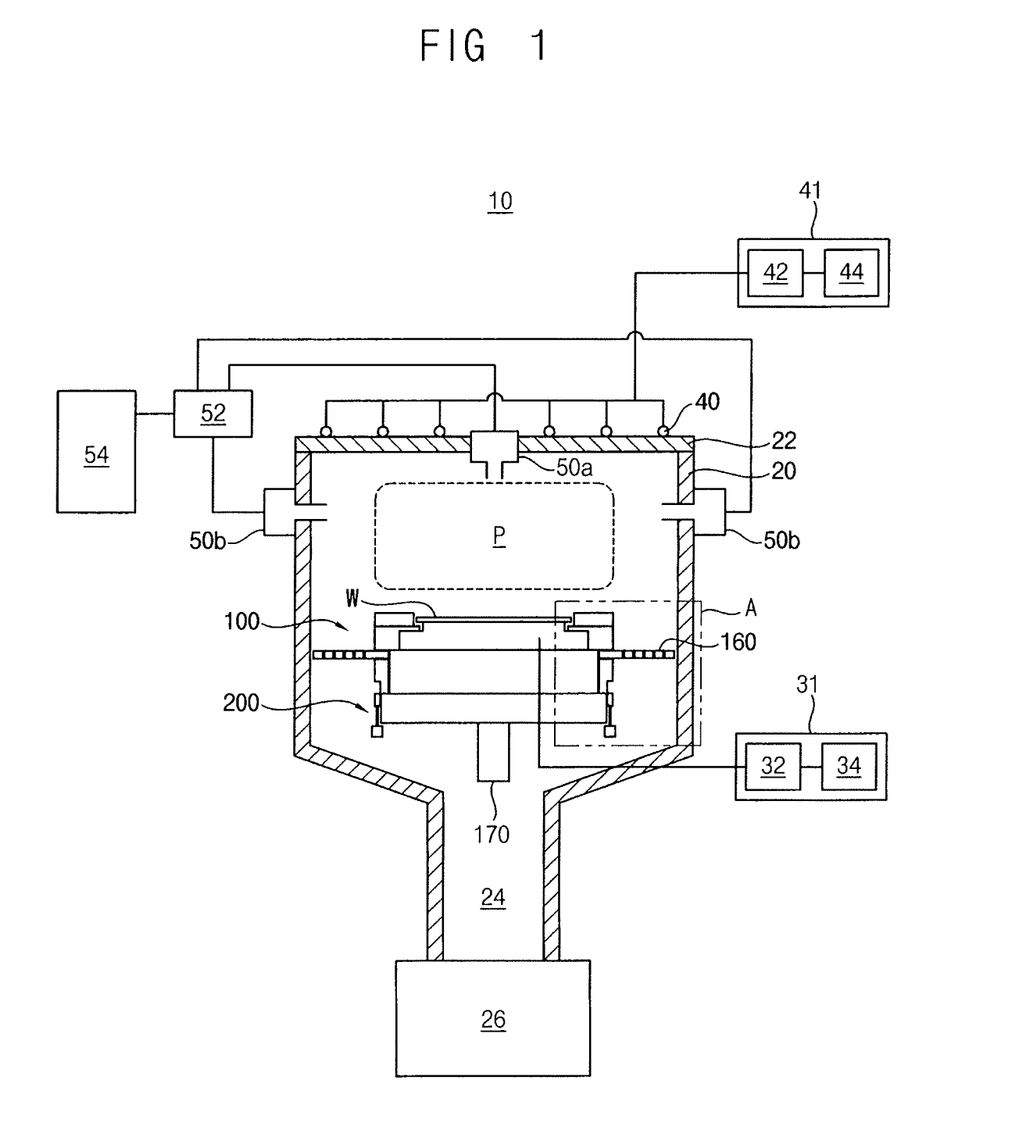
FIG. 1 illustrates a schematic diagram of a plasma processing apparatus in accordance with example embodiments.
Figure 2:
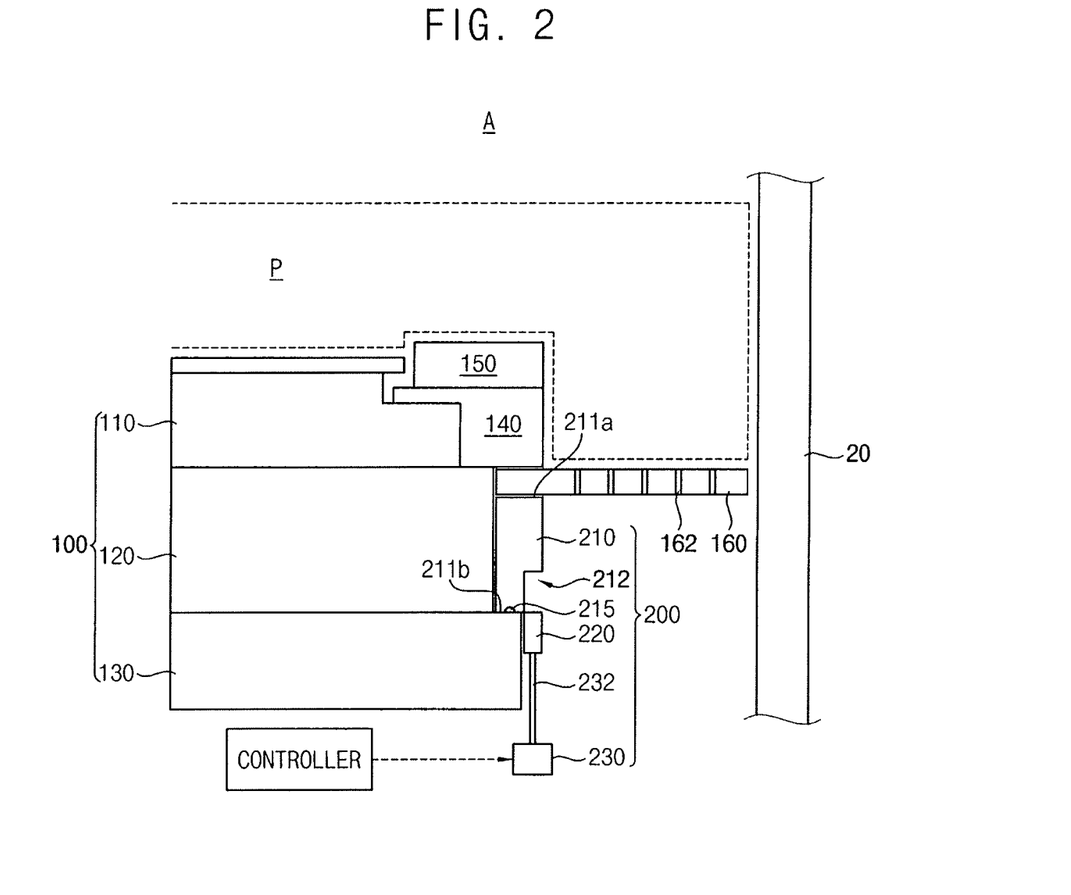
FIG. 2 illustrates an enlarged cross-sectional view of portion A of FIG. 1.
Figure 3:
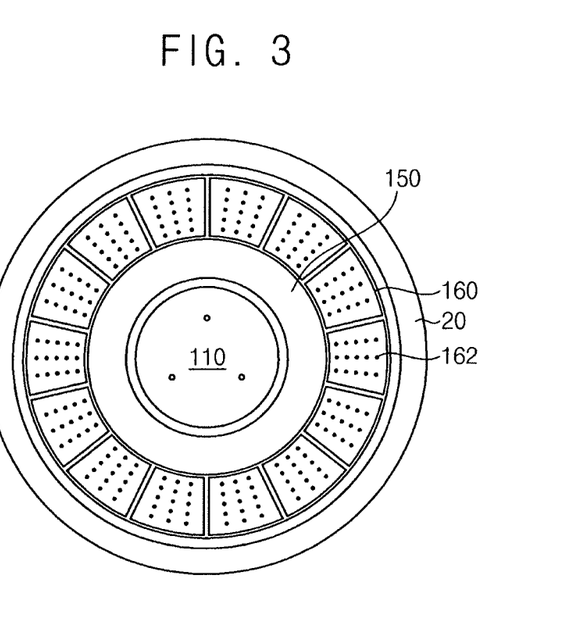
FIG. 3 illustrates a plan view of a substrate stage within a chamber in FIG. 1.
Figure 4:
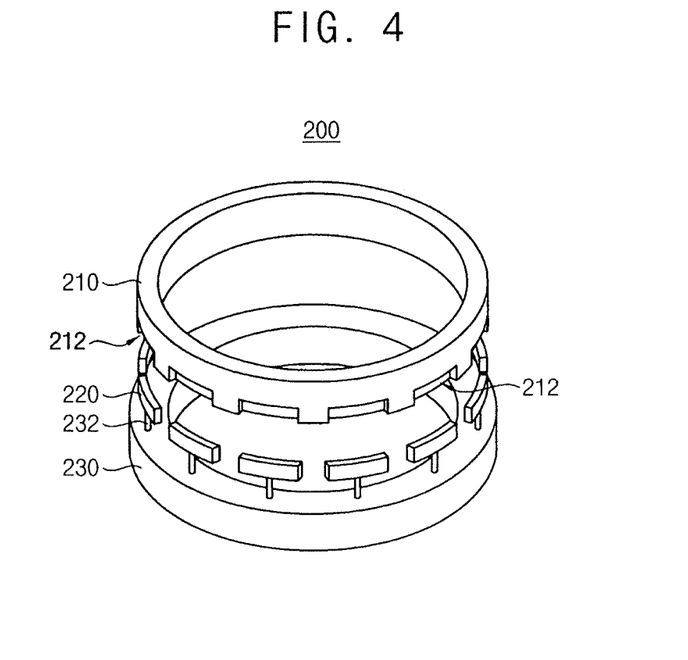
FIG. 4 illustrates a perspective view of a ground ring assembly around a substrate stage in FIG. 2.
Figure 5:
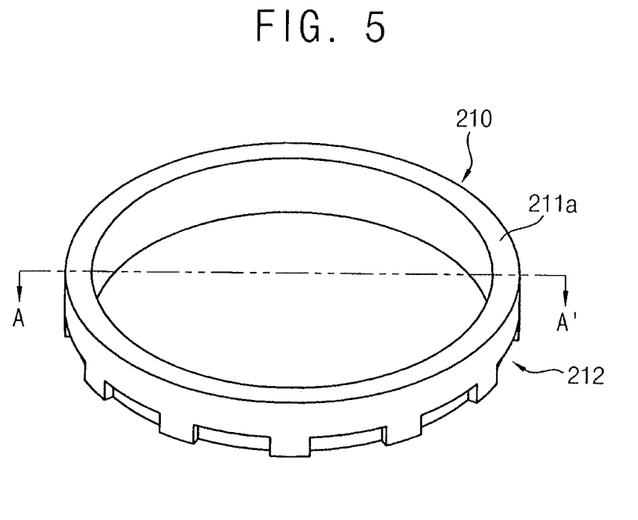
FIG. 5 illustrates a perspective view of a ground ring body of the ground ring assembly in FIG. 4.
Figure 6:
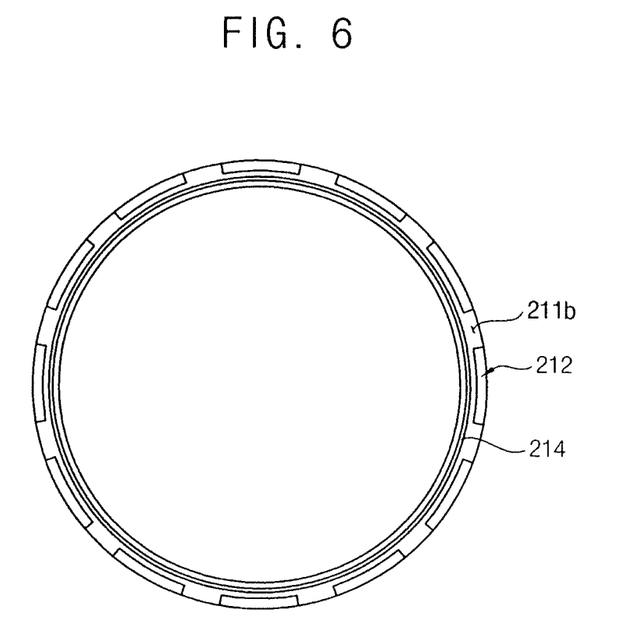
FIG. 6 illustrates a bottom view of a lower surface of the ground ring body in FIG. 5.
Figure 7:
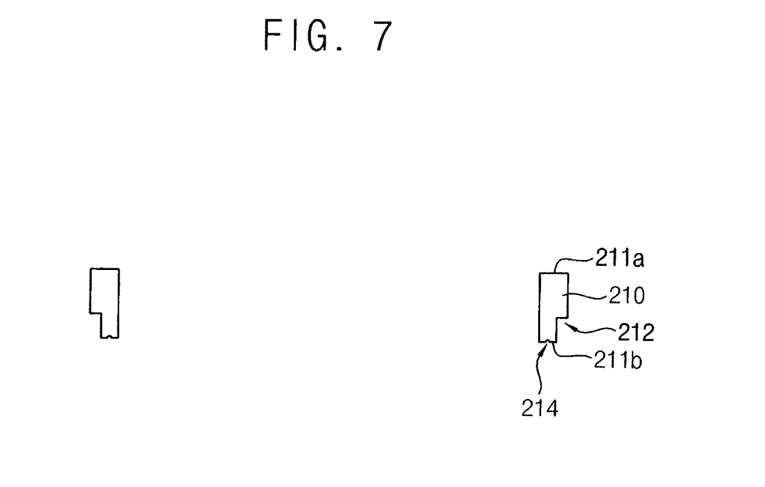
FIG. 7 illustrates a cross-sectional view taken along line A-A' in FIG. 5.
Figure 8A:
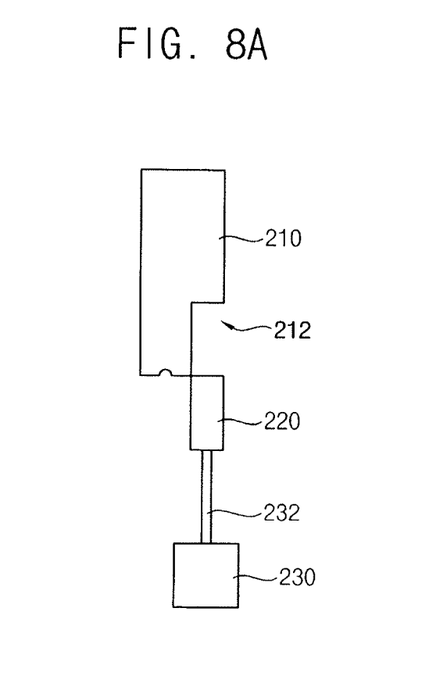
FIGS. 8A and 8B illustrate cross-sectional views of movement of a ground block of a ground ring assembly in FIG. 4.
Figure 8B:
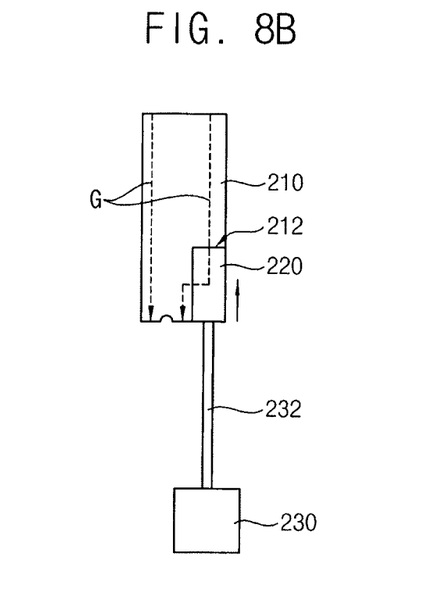
Figure 9:
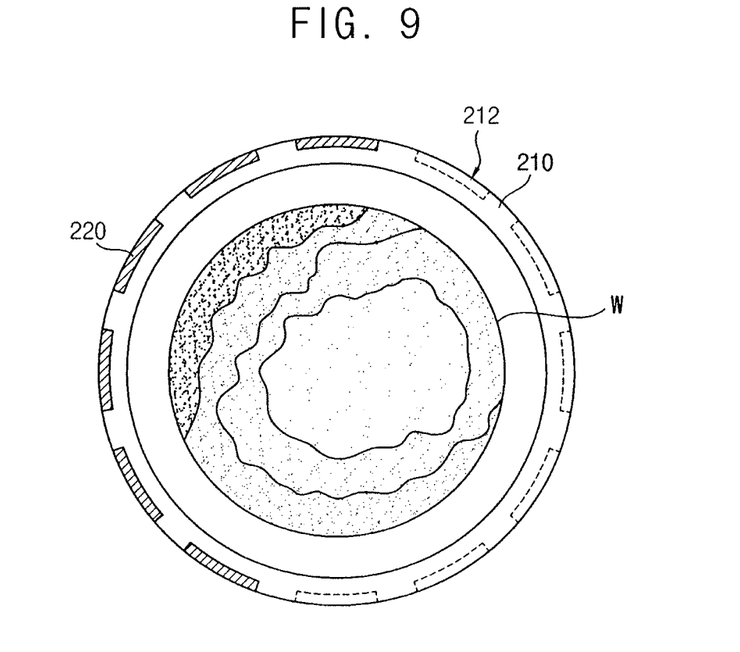
FIG. 9 illustrates a plan view of an arrangement of ground blocks for controlling asymmetric CD distribution on a wafer.

FIG. 1 is a block diagram illustrating a plasma processing apparatus in accordance with example embodiments. FIG. 2 is a cross-sectional view illustrating a portion of a substrate stage in FIG. 1. FIG. 3 is a plan view illustrating the substrate stage within a chamber in FIG. 1. FIG. 4 is a perspective view illustrating a ground ring assembly around the substrate stage in FIG. 2. FIG. 5 is a perspective view illustrating a ground ring body of the ground ring assembly in FIG. 4. FIG. 6 is a bottom view illustrating a lower surface of the ground ring body in FIG. 5. FIG. 7 is a cross-sectional view taken along the line A-A' in FIG. 5. FIGS. 8A to 8C are cross-sectional views illustrating movements of a ground block of the ground ring assembly in FIG. 4. FIG. 9 is a plan view illustrating an arrangement of the ground blocks for controlling asymmetric CD distribution on a wafer.

Referring to FIGS. 1 and 2, a plasma processing apparatus 10 may include a chamber 20, a substrate support apparatus 100 having a lower electrode 110, an upper electrode 40, a first power supply 41, and a second power supply 31. The substrate support apparatus 100 may include a substrate stage having the lower electrode 110, on which a substrate is disposed, and a ground ring assembly 200 installed around the substrate stage to be electrically grounded.

In example embodiments, the plasma processing apparatus 10 may be an apparatus configured to etch a layer on the substrate, e.g., on a wafer W, disposed within the chamber 20, e.g., an induced coupled plasma (ICP) chamber. However, plasma generated by the plasma processing apparatus may not be limited to the inductively coupled plasma, e.g., capacitively coupled plasma, microwave plasma, etc., may be generated by the plasma processing apparatus. Additionally, the plasma processing apparatus may not be limited to the etching apparatus, e.g., the plasma process apparatus may be used as a deposition apparatus, a cleaning apparatus, etc. Here, the substrate may include, e.g., a semiconductor substrate, a glass substrate, etc.

The chamber 20 may provide a sealed space where a plasma etch process is performed on the substrate, i.e., on the wafer W. The chamber 20 may be a, e.g., cylindrically shaped, vacuum chamber. The chamber 20 may include a cover 22 which covers an open upper end portion of the chamber 20. The cover 22 may airtightly seal the upper end portion of the chamber 20.

A gate for opening and closing a loading/unloading port of the wafer W may be provided in a sidewall of the chamber 20. The wafer W may be loaded/unloaded onto/from the substrate stage through the gate.

A gas exhaust port 24 may be provided in a bottom portion of the chamber 20, and a gas exhaust unit 26 may be connected to the gas exhaust port 24 through a gas exhaust line. The gas exhaust unit 26 may include a vacuum pump, e.g., a turbo-molecular pump or the like, to control a pressure of the chamber 20 so that the processing space inside the chamber 20 may be depressurized to a desired vacuum level. Additionally, process by-products and residual process gases may be discharged through the gas exhaust port 24.

The upper electrode 40 may be disposed outside the chamber 20 such that the upper electrode 40 faces the lower electrode 110. The upper electrode 40 may be disposed on the cover 22. The upper electrode 40 may include a radio frequency antenna. The radio frequency antenna may have a plan coil shape. The cover 22 may include a, e.g., circular plate shaped, dielectric window. The dielectric window may include a dielectric material, e.g., aluminum oxide ($Al_2O_3$). Power from the antenna of the upper electrode 40 may be transferred into the chamber 20 through the dielectric window of the cover 22.

For example, the upper electrode 40 may include coils having a spiral shape or a concentric shape. The coil may generate inductively coupled plasma P in a space of the chamber 20. Herein, the coils may be described exemplarily, however, it may be understood that the number, arrangement, etc. of the coils may not be limited thereto.

In example embodiments, the plasma processing apparatus 10 may further include a gas supply unit for supplying gas into the chamber 20. For example, the gas supply unit may include gas supply lines 50a, 50b, a flow controller 52, and a gas supply source 54, as gas supply elements. The gas supply lines 50s, 50b may be connected to an upper portion and/or a side portion of the chamber 20 to supply gas into the chamber 20 therethrough. For example, the gas supply lines may include a vertical gas supply line 50a which penetrates through the cover 22 and a horizontal gas supply line 50b which penetrates through the sidewall of the chamber 20. Various gases may be supplied into the plasma space of the chamber 20 through the vertical gas supply line 50a and the horizontal gas supply line 50b.

The gas supply unit may supply different gases having a desired mixture ratio. The gas supply source 54 may store a plurality of gases, and the gases may be supplied through a plurality of gas lines connected to the gas supply lines 50a, 50b, respectively. The flow controller 52 may control an amount of the gases supplied into the chamber 20 through the gas supply lines 50a, 50b. The flow controller 52 may control independently or commonly the supply amounts of the gases supplied to the vertical gas supply line 50a and the horizontal gas supply line 50b, respectively. For example, the gas supply source 54 may include a plurality of gas tanks, and the flow controller 52 may include a plurality of mass flow controllers (MFCs) corresponding to the gas tanks. The mass flow controllers may control independently the supply amounts of the gases respectively.

The first power supply 41 may apply a plasma source power to the upper electrode 40. For example, the first power supply 41 may include a source RF power source 44 and a source RF matcher 42 as plasma source elements. The source RF power source 44 may generate a radio frequency (RF) signal. The source RF matcher 42 may match impedance of the RF signal generated by the source RF power source 44 using the coils to control generation of plasma.

The second power supply 31 may apply a bias source power to the lower electrode 110. For example, the second power supply 31 may include a bias RF power supply 34 and a bias RF matcher 32, as bias elements. The lower electrode 110 may attract plasma atoms or ions generated within the chamber 20. The bias RF power supply 34 may generate a radio frequency (RF) signal. The bias RF matcher 32 may match impedance of the bias RF signal by controlling bias voltage and bias current applied to the lower electrode 110. The bias RF power supply 34 and the source RF power source 44 may be synchronized or desynchronized with each other through a synchronizer of a controller.

The controller may be connected to the first power supply 41 and the second power supply 31, and control operations thereof. The controller having a microcomputer and various interface circuits may control an operation of the plasma processing apparatus based on programs and recipe information stored in an external or internal memory.

In particular, the controller may generate a plasma power control signal and a bias power control signal. The first power supply 41 may apply a plasma source power to the upper electrode 40 in response to the plasma power control signal. The second power supply 31 may apply a bias source power to the lower electrode 110 in response to the bias source power control signal.

The first power supply 41 may apply a radio frequency signal to the upper electrode 40 in response to the plasma power control signal. For example, the radio frequency power may be generated to have a frequency range of about 27 MHz to about 2.45 GHz, and a RF power range of about 100 W to about 1000 W. For example, the radio frequency power may be generated to have a frequency of about 40 MHz to about 1.5 GHz.

As the radio frequency power having a predetermined frequency (e.g., 13.56 MHz) is applied to the upper electrode 40, an electromagnetic field induced by the upper electrode 40 may be applied to a source gas supplied within the chamber 20 to generate plasma P. As the bias power having a predetermined frequency less than the frequency of the plasma power is applied to the lower electrode, plasma atoms or ions generated within the chamber 20 may be attracted toward the lower electrode.

In example embodiments, the substrate support apparatus 100 may be disposed within the chamber 20 to support the wafer W. The substrate support apparatus 100 may include the substrate stage to support the wafer W, and the ground ring assembly 200 arranged to surround the substrate stage. Additionally, the substrate support apparatus 100 may further include a baffle member 160 which is arranged around the substrate stage to be electrically connected to the ground ring assembly 200.

In particular, referring to FIG. 2, the substrate stage may include the lower electrode 110, an insulation plate 120, a lower ground plate 130, a side insulation ring 140, and an edge ring 150. The substrate, i.e., the wafer W, may be positioned on the lower electrode 110, such that the lower electrode 110 may be between the substrate and the insulation plate 120.

In detail, as illustrated in FIG. 3, the lower electrode 110 may be an electrode plate having a circular plate. The lower electrode 110 may include an electrostatic chuck for holding the wafer W using electrostatic force. The wafer W may be adsorptively held on the electrostatic chuck when a direct current is applied thereto by a DC power source.

As illustrated in FIG. 1, the lower electrode 110 may have a diameter greater than a diameter of the wafer W. Additionally, the lower electrode 110 may have a cooling channel therein. In order to increase a control accuracy of a wafer temperature, a heat transfer gas, e.g., He gas, may be supplied to a gap between the electrostatic chuck and the wafer W. The lower electrode 110 may be installed to be movable upwardly and downwardly, e.g., along a direction normal to a top surface of the wafer W, by a driving support portion 170.

As illustrated in FIG. 2, the insulation plate 120 may be arranged between the lower electrode 110 and the lower ground plate 130 to electrically insulate therebetween. The insulation plate 120 may be positioned under the lower electrode 110.

The lower ground plate 130 may be positioned in a lower portion of the substrate stage. The lower ground plate 130 may have a space with an open upper end. The open upper end of the lower ground plate 130 may be covered with the insulation plate 120.

The side insulation ring 140 may be arranged to cover an outer lateral surface of the lower electrode 110. The side insulation ring 140 may serve as a cover ring for protecting the outer lateral surface of the lower electrode 110. The edge ring 150 may be on the side insulation ring 140, and may serve as a focus ring for precisely securing the wafer W and focusing plasma onto the wafer W. For example, as illustrated in FIG. 3, the edge ring 150 may surround an entire perimeter of the lower electrode 110 along a lateral surface of the lower electrode 110, e.g., a topmost surface of the edge ring may be higher than that of the lower electrode 110 (FIG. 2).

The baffle member 160 may be arranged outside the outer lateral surface of the lower electrode 110. For example, as illustrated in FIG. 3, the baffle member 160 may be external with respect to the lower electrode 110, and may be spaced apart radially from the lower electrode 110 to surround, e.g., an entire perimeter of, the lower electrode 110. The baffle member 160 may include a conductive material. The baffle member 160 may have a conductive ring having an inner diameter and an outer diameter. As illustrated in FIGS. 2-3, the baffle member 160 may include an annular-shaped plate which is arranged to extend parallel with the upper surface of the lower electrode 110.

An upper surface of the baffle member 160 may be positioned lower than an upper surface of the wafer W, as illustrated in FIG. 2. The baffle member 160 may be arranged at a same level as or below the lower surface of the lower electrode 110. The baffle member 160 may be arranged to surround a circumferential surface of the insulation plate 120. An inner surface of the baffle member 160 may be supported to be spaced apart from or make contact with the circumferential surface of the insulation plate 120. An outer surface of the baffle member 160 may be supported to be spaced apart from or make contact with the sidewall of the chamber 20.

Referring back to FIG. 1, the plasma P may be generated within a space, e.g., volume, defined by the wafer W, the edge ring 150, the side insulation ring 140 and the baffle member 160. As described later, the baffle member 160 may be electrically connected to a ground ring body 210, so that the baffle member 160 may be electrically grounded during the plasma processing process. Accordingly, the baffle member 160 may remove electrons from the plasma to increase ion energy during the process, thereby improving etching uniformity.

As illustrated in FIGS. 2-3, the baffle member 160 may include a plurality of perforations 162 which allow gas to flow therethrough. Process by-products and residual process gases generated within the chamber 20 may be discharged through the gas exhaust port 24 via the perforations 162 of the baffle member 160. For example, an opening ratio of the perforations 162 in the baffle member 160 may range from about 20% to about 50%.

In example embodiments, as illustrated in FIGS. 1-2 and 4, the ground ring assembly 200 may include the ground ring body 210 extending along a circumference of the substrate stage to have an annular shape and having a plurality of recesses 212 along a lower circumferential portion thereof, and a plurality of ground blocks 220 movable upwardly and downwardly to be received within the recesses 212, respectively. The ground ring body 210 and the ground blocks 220 may include a conductive material. For example, the ground ring body 210 and the ground block 220 may include a metal, e.g., aluminum. Additionally, the ground ring assembly 200 may further include a driving mechanism 230 to independently drive the ground blocks 220.

In detail, as illustrated in FIG. 4, the ground ring body 210 may have an entirely annular shape. The ground ring body 210 may be arranged to surround the circumferential surface of the insulation plate 120, as illustrated in FIGS. 1-2. The ground ring body 210 may serve as an inner liner.

As further illustrated in FIG. 2, the ground ring body 210 may be positioned below the baffle member 160. An upper surface 211a of the ground ring body 210 may electrically contact a lower surface of the baffle member 160.

The ground ring body 210 may be arranged on a peripheral region of an upper surface of the lower ground plate 130. A lower surface 211b of the ground ring body 210 may electrically contact the peripheral region of the upper surface of the lower ground plate 130. Accordingly, the electrons from the plasma may be removed through a conductive ground path of the baffle member 160 and the ground ring body 210.

An O-ring recess 214 may be formed in the lower surface 211b of the ground ring body 210 (FIG. 6) to receive an O-ring 215, as illustrated in FIG. 2. The ground ring body 210 and the lower ground plate 130 may be airtightly sealed from the chamber 20 by the O-ring 215.

The recesses 212 in the ground ring body 210 may be formed in the surface of the ground ring body 210 exposed to the space of the chamber 20 to receive the ground blocks 220, e.g., the recesses 212 may be indentations into an outer surface of the ground ring body 210 facing away from the insulation plate 120 (FIGS. 4-5) and may have a predetermined depth along a radial direction (FIG. 7). As further illustrated in FIG. 4, the recesses 212 may be formed in the outer surface of the lower portion of the ground ring body 210 to be spaced apart from each other along a circumferential direction of the ground ring body 210. Distances between the recesses 212 along the circumference of the ground ring body 210 may be identical to or different from each other. A portion of the ground ring body 210 where the recess 212 is formed may have a relatively narrow ground path, and a portion of the ground ring body 210 where the recess 212 is not formed may have a relatively wide ground path.

As illustrated in FIG. 4, a plurality of the ground blocks 220 may be installed under the ground ring body 210 to move upwardly and downwardly, e.g., each of the plurality of the ground blocks 220 may correspond (e.g., in shape, size, and position) to a respective recess 212 to fit in the respective recess 212 in accordance with the upward movement. For example, as illustrated in FIG. 4, the plurality of the ground blocks 220 may be positioned along a circumference of the driving mechanism 230 at positions corresponding to the recesses 212 in the ground ring body 210.

As further illustrated in FIG. 4, the driving mechanism 230 may be positioned under the ground ring body 210, and a plurality of vertical rods 232 may be positioned along a circumference of the driving mechanism 230. The plurality of rods 232 may be spaced apart from each other, and may extend from the driving mechanism 230 toward corresponding recesses 212 in the ground ring body 210. For example, the plurality of vertical rods 232 may be connected to the plurality of the ground blocks 220, respectively.

The driving mechanism 230 may independently move the rods 232 connected to the ground blocks 220 in a vertical direction, i.e., in an upward and downward direction. For example, the driving mechanism 230 may move each of the rods 232 independently of each other to fit the ground blocks 220 into respective recesses 212 in the ground ring body 210. The driving mechanism 230 may be connected to the controller to be controlled such that the ground blocks 220 selected from the plurality of the ground blocks 220 may move upward. Thus, the selected ground blocks 220 may move upwardly to be received into respective recesses 212 of the ground ring body 210.

As illustrated in FIGS. 8A and 8B, a selected ground block 220 may be moved upwardly by the driving mechanism 230 via a corresponding rod 232 to be received within the recess 212 of the ground ring body 210. Here, the ground block 220 may make contact with the recess 212 (FIG. 8B). Accordingly, the portion where the ground block 220 is received within the recess 212 may have a relatively wide ground path G in the vertical direction.

Accordingly, the ground ring body 210 of the ground ring assembly 200 may have a plurality of the ground paths in the vertical direction with different impedances according to the positions, volumes, etc. of the recesses 212. Further, the ground ring body 210 may have a plurality of the ground paths in the vertical direction with different impedances depending on whether or not the ground blocks 220 are received within the recesses 212.

Alternatively, a plurality of the ground blocks 220 may be installed laterally from the ground ring body 210 to move forwardly or backwardly toward a center of the ground ring body 210. The driving mechanism 230 may independently move rods 232 connected to the ground blocks 220 in a radial direction.

Referring to FIG. 9, the controller (in FIG. 2) may perform an analysis of plasma distribution on the wafer. FIG. 9 illustrates results of a distribution map on the wafer W where the distribution is asymmetric, thereby causing non-uniform etching. In order to resolve the asymmetric distribution, some ground blocks 220 may be selected from the plurality of the ground blocks 220, e.g., in accordance with the asymmetric distribution, to be moved, e.g., upwardly, to contact corresponding recesses 212 of the plurality of recesses to adjust distribution uniformity, e.g., to compensate for non-uniformity. For example, with reference to FIG. 9, only ground blocks 220 in the top left region of the wafer W may be moved upward to increase plasma distribution thereover. Thus, due to the contact between some of the ground blocks 220 and corresponding recesses 212, the impedances (or capacitances) of a plurality of the ground paths, through which the electrons from plasma move, may be controlled to be intentionally asymmetric, to thereby improve azimuthal non-uniformity (distribution asymmetry) on the wafer W.

As mentioned above, the ground ring assembly 200 may include the ground ring body 210 extending along the circumference of the substrate stage to have an annular shape and having a plurality of the recesses 212 along the lower circumferential portion thereof, and a plurality of the ground blocks 220 movable upwardly and downwardly to be received within the respective recesses 212. The ground blocks selected from a plurality of the ground blocks 220 may be moved to make contact with the inner surface of the recesses 212. Thus, the impedances of a plurality of the ground paths of the ground ring body 210 may be controlled mechanically to improve the azimuthal non-uniformity (CD distribution asymmetry) on a wafer.

Hereinafter, a method of processing a substrate using the plasma processing apparatus in FIG. 1 will be explained with reference to FIG. 10.

Figure 10:
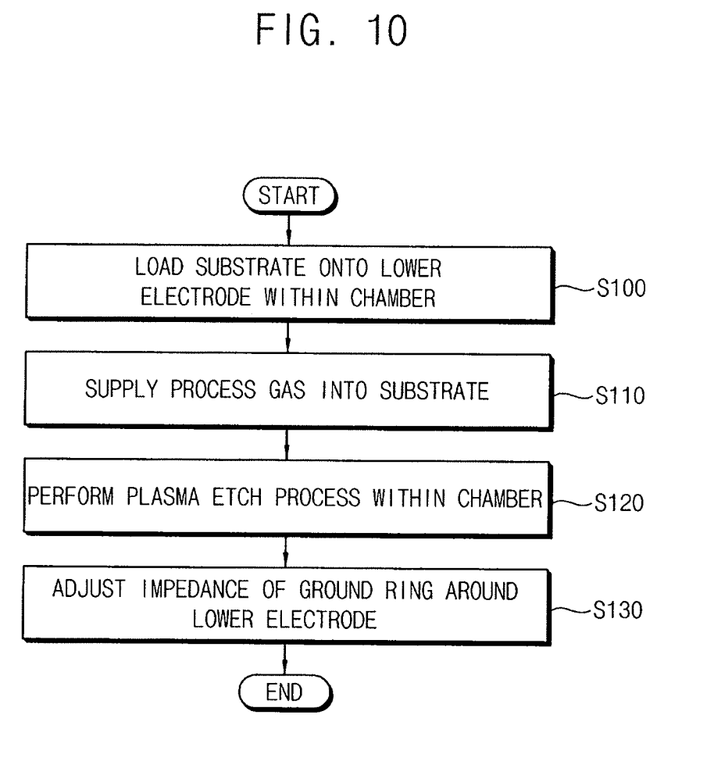
FIG. 10 illustrates a flow chart of a plasma processing method in accordance with example embodiments.

FIG. 10 is a flow chart illustrating a plasma processing method in accordance with example embodiments.

Referring to FIGS. 1, 2, 4, and 10, the substrate, i.e., the wafer W, may be loaded into the chamber 20 (S100), a process gas may be supplied onto the substrate (S110), and a plasma etch process may be performed within the chamber 20 (S120). Finally, impedance of the ground ring around the lower electrode 110 may be adjusted (S130).

In detail, first, the substrate, e.g., the wafer W, may be loaded on an electrostatic chuck of the substrate stage within the chamber 20, e.g., positioned on the lower electrode 110. For example, the wafer W may be a semiconductor wafer. Then, pressure in the chamber 20 may be controlled to a desired vacuum level by the gas exhaust unit 26, followed by introducing the process gas, e.g., the etching gas, into the chamber 20 through the gas supply lines 50a, 50b.

Then, a plasma power may be applied to the upper electrode 40 to generate plasma within the chamber 20, and bias power may be applied to the lower electrode 110 to generate plasma P and perform the plasma etch process. The first power supply 41 may apply a radio frequency power signal to the upper electrode 40 in response to a plasma power control signal from a controller. For example, as the radio frequency power having a predetermined frequency (e.g., 13.56 MHz) is applied to the upper electrode 40, an electromagnetic field induced by the upper electrode 40 may be applied to a source gas within the chamber 20 to generate plasma. The second power supply 31 may apply a bias power signal to the lower electrode 110, in response to a bias power control signal from the controller, to perform the etch process, e.g., of an object layer on the wafer W.

Then, the impedance of the ground ring surrounding the lower electrode 110 may be adjusted (S130). The step of adjusting the impedance of the ground ring may be performed right after the substrate is loaded.

In example embodiments, in order to compensate an asymmetric distribution of etching on the wafer W, e.g., due to asymmetric plasma application, ground blocks 220 selected from the plurality of the ground blocks 220 may be moved to be received within respective recesses 212 of the ground ring body 210 to adjust the distribution. That is, when analysis results of a distribution map on the wafer W shows an asymmetric distribution fault, the impedances (or capacitances) of the plurality of ground paths in the ground ring body 210, through which electrons from plasma move, may be controlled to be intentionally asymmetric, to thereby improve distribution asymmetry on the wafer W.

The driving mechanism 230 may independently move the rods 232 connected to the selected ground blocks 220 in a vertical direction in response to a control signal. Thus, the selected ground blocks 220 may move upwardly to be received into the respective recesses 212 of the ground ring body 210. Here, the ground block 220 may make contact with the recess 212. Accordingly, a portion where the ground block 220 is received within the recess 212 may have a relatively wide ground path. Thus, the impedances (or capacitances) of a plurality of the ground paths in the ground ring body 210 may be controlled to be intentionally asymmetric along the circumferential direction of the ground ring body 210.

During the plasma etch process, the electrons from the plasma may be removed through the grounded baffle member 160 and the ground ring body 210. The electrons may be removed through a plurality of the ground paths of the ground ring body 210. The impedances (capacitances) of the ground paths may be controlled such that the transfer paths of the electrons may be adjusted to be azimuthally asymmetric. Thus, the azimuthal non-uniformity (CD distribution asymmetry) on the wafer may be improved.

The above plasma processing apparatus and plasma process method may be used to manufacture semiconductor devices including logic devices and memory devices. For example, the semiconductor device may be applied to logic devices, e.g., central processing units (CPUs), main processing units (MPUs), or application processors (APs), or the like, volatile memory devices, e.g., dynamic random access memory (DRAM) devices, static random access memory (SRAM) devices, and/or non-volatile memory devices, e.g., flash memory devices, phase change random access memory (PRAM) devices, magnetoresistive random access memory (MRAM) devices, resistive random access memory (ReRAM) devices, or the like.

By way of summation and review, as the semiconductor devices have been highly integrated, non-uniformity in a radial direction (from a center to an edge region) as well as a circumferential direction (azimuthal direction) on a surface of a wafer surface may occur during plasma etching. Accordingly, techniques for improving the asymmetric distribution on the wafer may be required.

Therefore, example embodiments provide a substrate support apparatus having an edge ring capable of improving asymmetric distribution on a wafer. Example embodiments also provide a substrate processing apparatus including the substrate support apparatus.

That is, according to example embodiments, a substrate support apparatus may include a ground ring assembly arranged along a circumference of a substrate stage to remove electrons from plasma. The ground ring assembly may include an annular-shaped ground ring body having a plurality of the recesses along a lower circumferential portion thereof and a plurality of ground blocks independently movable to be received into the respective recesses. Thus, impedances of a plurality of ground paths in the ground ring body may be controlled mechanically to improve an azimuthal non-uniformity (CD distribution asymmetry) on a wafer.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods herein.

The controllers, power management features, interfaces, and other signal providing, signal generating, and signal processing features of the embodiments described herein may be implemented in non-transitory logic which, for example, may include hardware, software, or both. When implemented at least partially in hardware, the controllers, power management features, interfaces, and other signal providing, signal generating, and signal processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the controllers, power management features, interfaces, and other signal providing, signal generating, and signal processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A substrate support apparatus, comprising:
a substrate stage to support a substrate; and
a ground ring assembly along a circumference of the substrate stage, the ground ring assembly including:
a ground ring body surrounding a lateral side of the substrate stage, the ground ring body having:
an inner surface facing the lateral side of the substrate stage, and an outer surface opposite the inner surface, the outer surface of the ground ring body including a plurality of recesses along a circumferential portion thereof, and a plurality of ground blocks movable to be received into respective recesses of the plurality of recesses, the plurality of ground blocks including a conductive material to be electrically grounded, wherein the plurality of the recesses are spaced apart from each other along a circumference of a lower portion of the outer surface of the ground ring body, and the plurality of ground blocks is below the ground ring body to be movable upwardly and downwardly.

2. The substrate support apparatus as claimed in claim 1, further comprising a driving mechanism to independently drive each of the ground blocks.

3. The substrate support apparatus as claimed in claim 2, wherein the driving mechanism is to independently move rods connected to each of the plurality of ground blocks, respectively, upwardly and downwardly.

4. The substrate support apparatus as claimed in claim 1, wherein, when a ground block of the plurality of ground blocks is received into a corresponding recess of the plurality of recesses, the ground block contacts an inner surface of the corresponding recess.

5. The substrate support apparatus as claimed in claim 1, further comprising a baffle member above the ground ring body along the circumference of the substrate stage, the baffle member being electrically connected to and directly contacting an upper surface of the ground ring body.

6. The substrate support apparatus as claimed in claim 5, wherein an upper surface of the baffle member is positioned lower than an upper surface of the substrate.

7. The substrate support apparatus as claimed in claim 5, wherein the baffle member includes an annular-shaped plate which extends parallel with an upper surface of the substrate stage.

8. The substrate support apparatus as claimed in claim 5, wherein the baffle member includes a plurality of perforations which allow a gas to flow therethrough.

9. The substrate support apparatus as claimed in claim 1, wherein:

the substrate stage includes a lower ground plate, an insulation plate, and a lower electrode sequentially arranged on one another, and the ground ring body is on an upper surface of the lower ground plate and surrounds an outer surface of the insulation plate.

10. A substrate support apparatus, comprising:

a substrate stage to support a substrate;

a ground ring assembly along a circumference of the substrate stage, the ground ring assembly including:

a ground ring body surrounding a lateral side of the substrate stage, the ground ring body having:

an inner surface facing the lateral side of the substrate stage, and an outer surface opposite the inner surface, the outer surface of the ground ring body including a plurality of recesses spaced apart from each other along a circumference of a lower portion of the outer surface of the ground ring body, and a plurality of ground blocks movable to be received into respective recesses of the plurality of recesses, the plurality of ground blocks including a conductive material to be electrically grounded; and a baffle member above the ground ring body along the circumference of the substrate stage, the baffle member being electrically connected to the ground ring body.

11. The substrate support apparatus as claimed in claim 10, further comprising a driving mechanism and a plurality of rods extending from the driving mechanism, the plurality of rods being connected to the plurality of ground blocks, respectively.

12. The substrate support apparatus as claimed in claim 11, wherein each of the plurality of rods is independently moveable to connect the plurality of blocks and corresponding ones of the plurality of recesses.

13. The substrate support apparatus as claimed in claim 10, wherein an upper surface of the baffle member is positioned lower than an upper surface of the substrate stage.

14. The substrate support apparatus as claimed in claim 10, wherein:

the substrate stage includes a lower ground plate, an insulation plate, and a lower electrode sequentially arranged on one another, and the ground ring body is on an upper surface of the lower ground plate and surrounds an outer surface of the insulation plate, the plurality of recesses facing away from the insulation plate, and an upper surface of the ground ring body directly contacting a bottom surface of the baffle member.

15. A plasma processing apparatus, comprising:

a chamber to provide a space for processing a substrate;

a substrate stage to support the substrate within the chamber, the substrate stage including a lower electrode;

an upper electrode in an upper portion of the chamber to face the lower electrode;

a first power supply to apply a plasma power to the upper electrode;

a second power supply to apply a bias power to the lower electrode; and a ground ring assembly along a circumference of the substrate stage, the ground ring assembly including:

an annular-shaped ground ring body surrounding a lateral side of the substrate stage, the ground ring body having:

an inner surface facing the lateral side of the substrate stage, and an outer surface opposite the inner surface, the outer surface of the ground ring body including a plurality of recesses along a circumferential portion thereof, and a plurality of ground blocks, the plurality of ground blocks being spaced apart from each other along the circumferential portion of the ground ring body, and being movable to be received into respective ones of the plurality of recesses.

16. The plasma processing apparatus as claimed in claim 15, further comprising a driving mechanism to independently drive the each of the plurality of ground blocks.

17. The plasma processing apparatus as claimed in claim 15, further comprising a baffle member above the ground ring body along the circumference of the substrate stage, the baffle member being electrically connected to the ground ring body.

18. The plasma processing apparatus as claimed in claim 17, wherein an upper surface of the baffle member is positioned lower than an upper surface of the substrate.

* * * * *